310-359 SR
12/2/86 XR 4,625,373

United States Patent [19]

Duffield et al.

[11] Patent Number: 4,625,373

[45] Date of Patent: Dec. 2, 1986

[54] METHOD OF MAKING A PRINTING HEAD FOR AN INK JET PRINTER

[75] Inventors: Peter Duffield, Wayland; David Hudson, Chelmsford, both of Mass.; Steven I. Zoltan, Brookfield, Conn.

[73] Assignee: Advanced Color Technology, Inc., Chelmsford, Mass.

[21] Appl. No.: 761,857

[22] Filed: Aug. 2, 1985

[51] Int. Cl.[4] .............................................. H01L 41/22

[52] U.S. Cl. ................................. 29/25.35; 29/157 C; 29/423; 310/328; 310/369; 346/140 R

[58] Field of Search .................. 29/25.35, 157 C, 423; 346/140 R; 310/369, 328

[56] References Cited

U.S. PATENT DOCUMENTS 3,857,049 12/1974 Zoltan ............................. 310/369 X 4,504,845 3/1985 Katner et al. .................. 29/25.35 X

*Primary Examiner*—Carl E. Hall

*Attorney, Agent, or Firm*—E. Thorpe Barrett

[57] ABSTRACT

The method of making a print head of the type that includes a piezoelectric transducer positioned within a metal housing having an annular channel in its inner surface that is sealed by a thin metal diaphragm to form an annular ink chamber. The transducer is in mechanical engagement with the inner surface of the diaphragm. The sudden removal of a voltage applied to the transducer expands the disk to reduce the volume of the ink chamber, rupture the meniscus, and force a droplet of ink from the printing orifice.

The housing is formed with an internal taper which permits a groove to be cut readily either by a casting or by a tool entering from the larger end of the central opening in the housing. An aluminum mandrel is tapered to match the taper on the inner surface of the housing and provided with an annular groove that corresponds to the groove in the housing. The mandrel is plated with nickel that will later form the diaphragm. The housing and mandrel are then plated with indium. The mandrel is then forced into the central opening of the housing and subjected to ultrasonic energy, or maintained under pressure at an elevated temperature, to form a cold weld. The mandrel is removed by dissolving it in a caustic solution.

27 Claims, 13 Drawing Figures

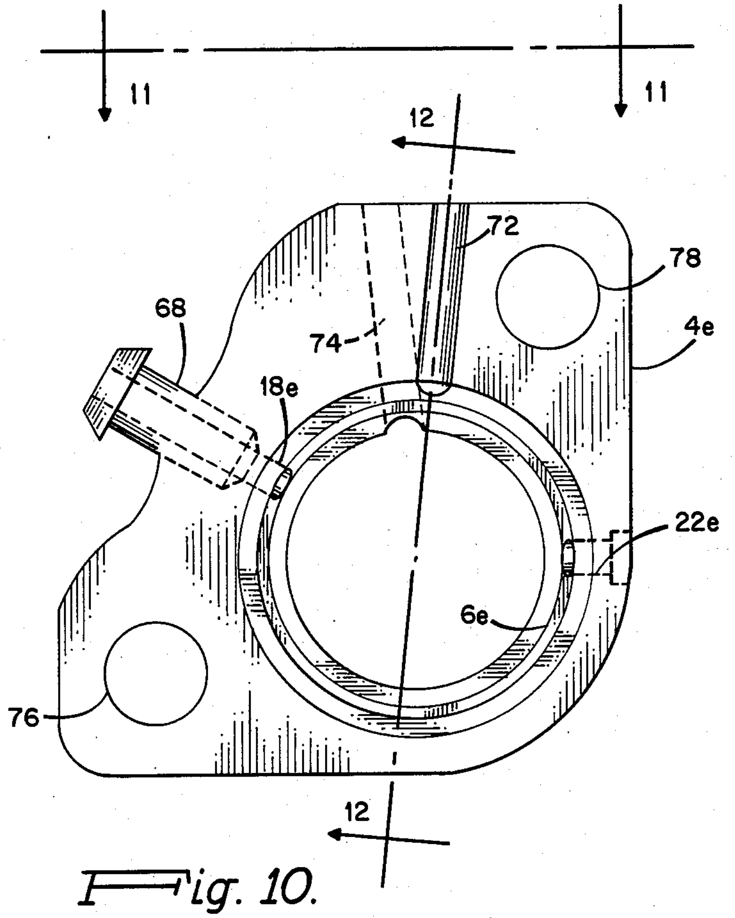
Fig. 10.
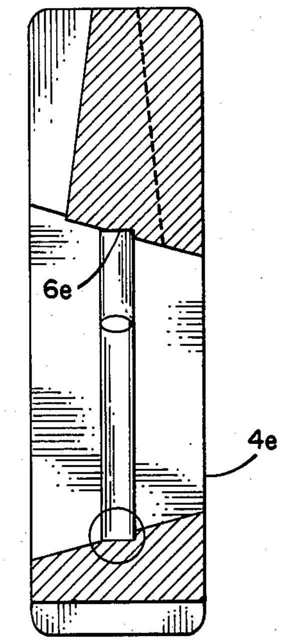
Fig. 12.
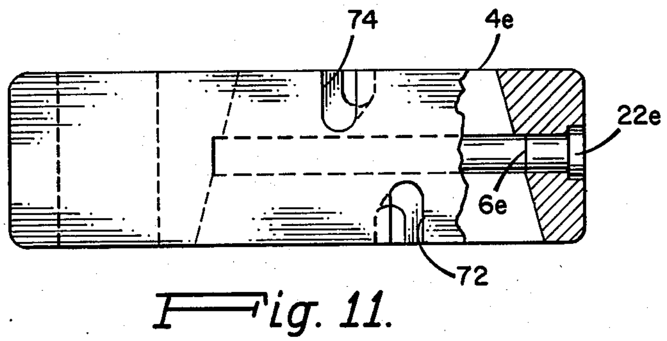
Fig. 11.
Fig. 13.
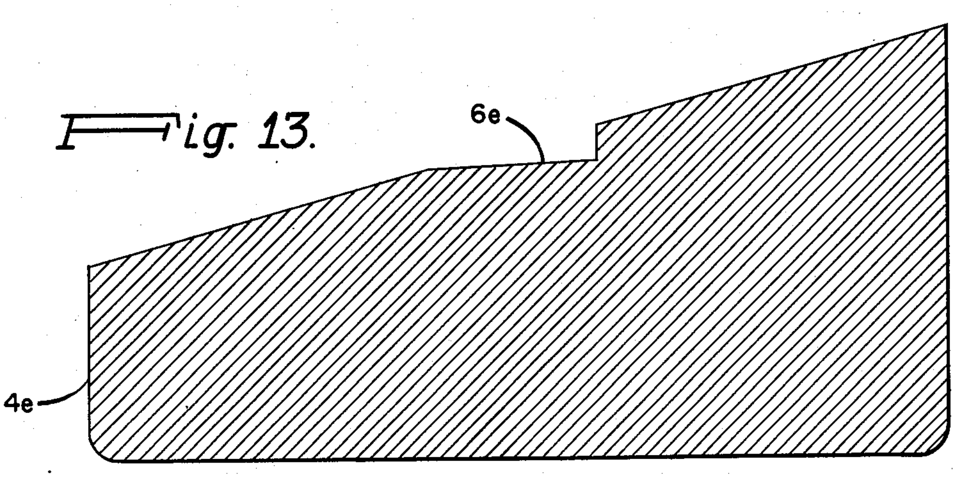

METHOD OF MAKING A PRINTING HEAD FOR AN INK JET PRINTER

BACKGROUND OF THE INVENTION

1. Field of the Invention

This invention relates to printing heads for ink jet printers and more particularly to a method of fabricating drop-on-demand ink jet printing heads.

2. Brief Description of the Prior Art

Many varieties of ejection systems for ink drop printers have been devised in an effort to achieve higher speed of operation while providing uniform dimensions of the ink droplets. It is important that the ink droplets be precisely controlled in size and ejected with sufficient velocity that the imprint on the medium is sharp and positioned with great accuracy.

For optimum operation such ink jet printing heads must be small in size and in particular require a minute shallow ink chamber to permit operation at higher drop repetition rates while maintaining relative uniformity in the size of the droplets. The necessary shape and small size makes fabrication difficult, particularly in quantity production. Various fabrication schemes have been used but none with complete satisfaction for the fabrication of ink jet printing heads having an annular ink channel. A print head of this general type is disclosed in U.S. Pat. No. 3,857,049 to Zoltan.

SUMMARY OF THE INVENTION

A print head of the kind contemplated here includes a disk or ring of piezoelectric ceramic material that is positioned within a metal housing having an annular channel in its inner surface that is sealed by a thin diaphragm, extending over one or more sides of the channel, to form an annular ink chamber. The piezoelectric material is in mechanical engagement with the inner surface of the annular diaphragm that forms the seal for the ink chamber. The sudden removal of a voltage applied to the opposite sides of the ceramic disk causes the disk rapidly to expand radially and, acting through the diaphragm, decrease the volume of the ink chamber, rupture the meniscus, and force a droplet of ink from the printing orifice. The pulse voltage is reapplied more slowly allowing replacement ink to enter the chamber from the supply opening without causing a rupture of the meniscus and allowing air to enter the system. The ink chamber is shallow and has a large ratio of surface area to volume that assists in damping the oscillations resulting from the ejection of each droplet of ink.

An ink jet print head of the type being considered here is described more fully in the U.S. patent application Ser. No. 761,860, entitled "Printing Head for Ink Jet Printer" by Steven Zoltan filed of even date herewith and assigned to the same assignee as this application.

The print head requires a very shallow ink channel on the inner surface of the annular housing which is difficult and expensive to fabricate by ordinary machine tool methods. Moreover, this channel is enclosed by a thin diaphragm that must be sealed ink tight to the housing and which serves to transmit the pulses from the transducer to the ink within the chamber.

The housing is formed with an internal taper which permits a groove to be cut readily either by a casting or by a tool entering from the larger end of the central opening in the housing. The housing is then plated with a metal capable of being cold welded. A metal mandrel is tapered to match the taper on the inner surface of the housing. This mandrel is plated with a metal that will later form the diaphragm. The mandrel is then plated with a metal capable of being cold welded to the metal that is plated on the housing. The mandrel is then forced into the central opening of the housing under relatively high pressure. Upon completion of the cold weld, the mandrel is removed by dissolving it in a suitable compound that will not attack the metal of the diaphragm.

In the example described here, the printer head housing is formed of brass and is plated with indium. The mandrel is formed of aluminum and is plated with nickel and then with indium. After the cold weld is completed the aluminum mandrel is dissolved in a caustic soda solution leaving the diaphragm in place on the interior of the housing wall.

A multiple section printing head is formed by aligning a number of heads and securing them in position on a supporting shaft that extends through an opening in the piezoelectric transducer. In an alternate construction, the housing is formed by a die casting that includes alignment openings and eliminates the requirement for an opening in the piezoelectric material.

BRIEF DESCRIPTION OF THE DRAWING

FIG. 10 is a plan view of a housing formed by die casting;

FIG. 11 is a top view, partly cut away, along line 11—11 of FIG. 10;

FIG. 12 is a sectional view along line 12—12 of FIG. 10; and

FIG. 13 is an enlarged partial section of the ink channel shown within the circle in FIG. 12.

DESCRIPTION OF THE PREFERRED EMBODIMENTS

Figure 1:
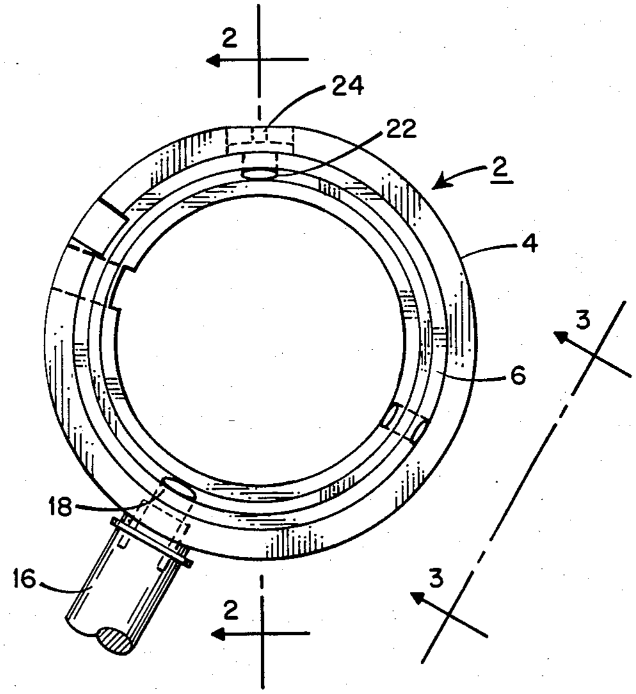
FIG. 1 is a plan view of the housing of an ink jet print head.
Figure 2:
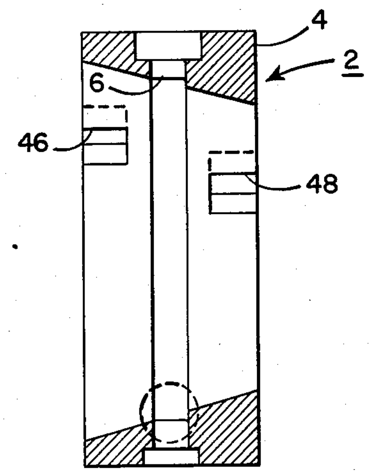
FIG. 2 is a sectional view of the housing along line 2—2 of FIG. 1.
Figure 3:
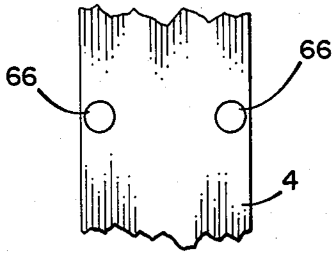
FIG. 3 is a partial view along line 3—3 of FIG. 1.
Figure 4:
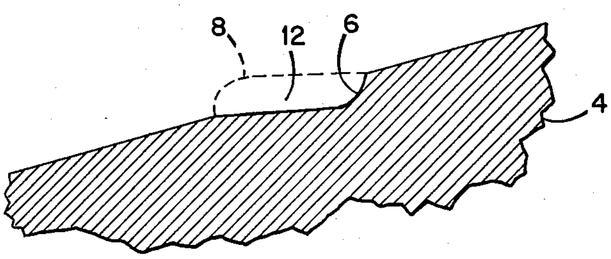
FIG. 4 is a partial enlarged view showing a cross section of the channel in the inner wall of the housing corresponding to the part enclosed in the circle in FIG. 2.

In the various views generally similar parts are indicated by the same numerals followed by a distinguishing letter.

As illustrated by FIGS. 1-4, the print head, generally indicated at 2, includes a ring-shaped housing 4, formed of brass or other suitable metal, which has an annular groove 6 in the inner surface. The groove 6 in combination with a diaphragm, diagrammatically indicated by a broken line 8 in FIG. 4, formed of nickel or other suitable metal, preferably with a thickness of approximately 0.001 inches, defines an annular ink chamber.

Ink is supplied to the chamber 12 in the usual manner from an ink source, not shown, through a conduit 16 that is connected to a port 18 that passes through the wall of the housing 4 into the chamber 12. Ink from the chamber 12 passes through a port 22 and is ejected through an orifice 24.

The ink chamber 12 can be considered as defined by a first annular wall section, formed by the body of the housing itself, and a second annular wall section formed by the diaphragm 8, which is flexible and much thinner than the other wall section.

Figure 6:
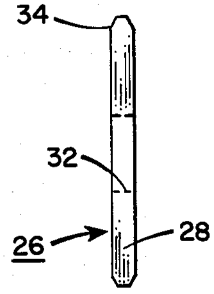
FIG. 6 is a side view along line 6—6 of FIG. 5.
Figure 5:
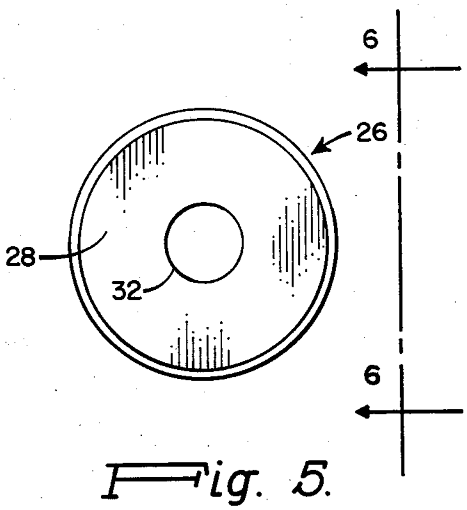
FIG. 5 is a plan view of the piezoelectric disk of the transducer.

A transducer, generally indicated at 26 in FIGS. 5 and 6, formed of a disk 28 of piezoelectric material, is positioned within the open central area of the housing 4 and makes mechanical contact around its perimeter with the annular diaphragm 8. The transducer 26 has a central opening 32 in the center of the piezoelectric disk 28 and is plated on each side with silver to form the electrodes of the transducer. The outer edge of the piezoelectric disk is chamfered, as indicated at 34, in FIG. 6 to prevent shorting of the electrodes by the diaphragm.

When a voltage pulse of correct polarity is applied to the silver coating on the surfaces of the disk 28 in the usual manner, the volume of the piezoelectric disk 28 expands radially and forces the diaphragm 8 outwardly to reduce the volume of the ink chamber 12. This sudden reduction in volume causes the ink to overcome the meniscus forces at the orifice 24 and eject one droplet of ink.

To manufacture the print head 2, the housing 4 is formed of brass by machining or any other appropriate method. The supply conduit 16 is secured to a connector that is press fitted into an opening from the inlet port 18. The orifice 24, which may be formed of a ruby jewel, is press fitted into an opening from the port 22.

Figure 7:
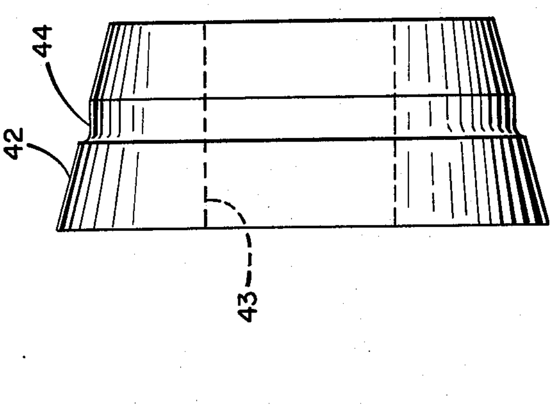
FIG. 7 is an elevational view of the mandrel used for fabricating the diaphragm.

A mandrel 42 (FIG. 7) of round cross section is formed of aluminum, preferably by die casting, in the contour shown with a central bore 43 through the mandrel. An annular channel 44 in the outer surface is a reverse mirror image of the channel 6 in the housing 4 and of equivalent dimensions. The mandrel is then plated with nickel to a thickness of about one mil. The housing 4 and the mandrel 42 are both then plated with indium. Indium is adaptable to cold welding and is resistant to attack by the inks commonly used in ink jet printers.

The mandrel 42 is then pressed into the housing 4 under from 100 to 400 pounds pressure forcing the surfaces into intimate contact and aligning the two channels 44 and 6 to form the ink chamber 12. The assembly is then placed in an oven at a temperature of 120° C. for one hour. This causes the two indium surfaces to be welded to each other and form a unitary structure. The process of cold welding is simplified by the use of ultrasonic vibrations. While the mandrel is under about 400 pounds pressure, ultrasonic vibrations at a frequency of 20 kilohertz are applied for a period of less than one second.

The indium coating on the larger and exposed end of the mandrel 42 is then removed by abrasion to expose the aluminum body. The entire unit is then immersed in a 10% solution of NaOH at 80° C. until the mandrel has been completely dissolved, approximately one-half hour, leaving the nickel plate on the interior of the housing 4 to form the diaphragm 8. The diaphragm now appears as indicated by the broken line 8 in FIG. 4 forming a shallow generally rectangular ink chamber.

The transducer 26 is then placed in the housing and engages the diaphragm 8 around its periphery. It is secured in place with epoxy resin. A pair of notches 46 and 48 in opposite edges of the housing 4 provide access paths for the leads to the transducer.

Figure 8:
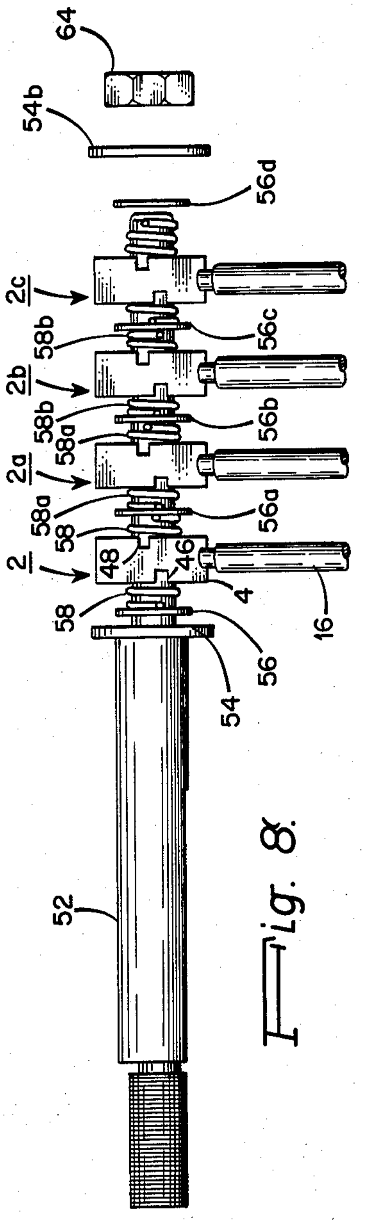
FIG. 8 shows an assembly of four printing heads for use in a multi-color ink jet printer.
Figure 9:
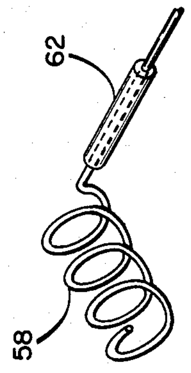
FIG. 9 shows a coil spring that is used to make connection to the piezoelectric transducer.

To form a multi-jet printing head, four of the heads, indicated at 2, 2*a*, 2*b*, and 2*c* in FIG. 8, are assembled on a teflon-covered portion of a post 52, the post passing through the opening 32 in the transducers. A retaining washer 54 abuts a shoulder on the post and provides one end support for the assembly. An insulating washer 56 is positioned between the retaining washer and a coil spring 58 (FIG. 9) which surrounds the opening 32 and engages one of the conducting surfaces of the disk 28. The spring has an extending arm which is covered with an insulating sleeve 62 and, when the heads are clamped together on the rod 52, will extend through the notch 46 in the housing to make connection with the pulse source. An identical coil spring 58 makes connection to the other side of the disk 28 and is positioned to extend through the notch 48. The adjacent head 2*a* has a similar coil spring 58*a* that is separated from the coil spring on the head 2 by an insulating washer 56*a*. The remaining heads are assembled on the rod 52 in a similar manner and are retained at the opposite end by an insulating washer 56*d*, a retaining washer 54*b* and a nut 64 which is in threaded engagement with the rod 52. The assembly is compressed together on the rod and the connections to the transducers are in the appropriate notches in the housings. When the assembly is complete, a silicone resin is injected into the spaces within the housings by injection through small openings 66 (FIG. 3) and then heat cured to form a resilient support and liquid-tight seal.

An alternate method of forming the housing is illustrated in FIGS. 10–13. The head 4*e* is formed by die casting a suitable alloy of zinc or other metals. The interior contour of the housing 4*e* is similar to the head 4 already described. An annular channel 6*e* is formed on the inner face to correspond to the channel in the mandrel 43. The exit port 22*e* is die cast into the housing and receives a jewel exit orifice as previously described. The inlet port 18*e* communicates with a connector 68 which in this instance is formed as an integral part of the die casting. Two channels 72 and 74 are formed in opposite sides of the housing for the leads to the transducer. Two transverse holes 76 and 78 are formed in the die casting for later use in alignment of a multi-jet printing head. The die casting is electroplated with indium to protect it from attack by the caustic solution and achieve a cold weld.

The diaphragm that completes the ink chamber is formed in the same manner as that already described. After the diaphragm has been formed, a disk of piezoelectric material is positioned as already described and the connection is made to the inlet connector 68. A jewel orifice such as the orifice 24 is press fitted into the outlet port 22*e*.

Four of the completed heads are then positioned on two assembly posts (not shown) that extend through the openings 76 and 78. Coil springs are suitably positioned to make connections to the transducers. The die castings are in direct face-to-face engagement and no silicone compound is required.

We claim:

1. The method of fabricating an ink jet head comprising the steps of forming a housing having a circular transverse opening with an annular groove in the internal surface thereof, said internal surface being tapered to form a first conical surface, providing a mandrel formed of a first metal having an exterior conical surface complimentary with said first conical surface and capable of being dissolved by chemical reaction with a predetermined compound, coating said exterior surface of said mandrel with a film of a second metal resistant to chemical reaction with said compound, coating each of said conical surfaces with a film of a third metal capable of being cold welded, pressing said mandrel into said housing and forcing said conical surfaces into intimate contact thereby sealing said groove to form an annular ink chamber and welding said mandrel and said housing into an integral structure, treating said mandrel with said compound thereby to dissolve said mandrel and cause the film of said second metal to remain in engagement with said first conical surface and provide a permanent seal and diaphragm wall for said chamber, and positioning a transducer to mechanically engage the inner wall of said chamber whereby when said transducer is energized by a voltage pulse, the ink in said chamber is subjected to a corresponding pressure pulse.

2. The method as claimed in claim 1 including the added steps of applying pressure in excess of about 100 pounds between said housing and said mandrel while at a temperature in excess of about 100° C., and maintaining those conditions until a cold weld is effected.

3. The method as claimed in claim 1 including the added step of applying ultrasonic energy to said mandrel and said housing while in intimate contact thereby to effect immediate welding.

4. The method as claimed in claim 1 wherein said mandrel is formed of aluminum.

5. The method as claimed in claim 4 wherein said compound is caustic soda.

6. The method as claimed in claim 1 wherein said second metal is nickel.

7. The method as claimed in claim 6 wherein the thickness of said second metal is about 0.001 inches.

8. The method as claimed in claim 1 wherein said third metal is indium.

9. The method as claimed in claim 1 wherein said transducer has a transverse opening.

10. The method as claimed in claim 9 including the additional steps of providing a retaining member, positioning a plurality of the ink jet printing heads so formed on said rod, said rod extending through said transverse openings, and securing said heads in close face-to-face relationship on said rod.

11. The method as claimed in claim 10 including the added steps of injecting a silicone solution into spaces within said heads, and curing said silicone solution.

12. The method as claimed in claim 1 wherein said mandrel has an annular groove in the external surface thereof positioned to interface with said groove in said housing when said conical surfaces are in intimate contact.

13. The method as claimed in claim 1 wherein said groove in said housing forms a relatively smooth junction with said internal conical surface along one edge and a relatively abrupt junction with said conical surface along the opposite edge of said groove.

14. The method as claimed in claim 1 wherein said groove has a first surface extending at a first angle with respect to said internal conical surface, and a second surface extending at a substantially greater angle with respect to said conical surface.

15. The method as claimed in claim 1 wherein the cross section of said groove, considered in combination with a continuation of said internal conical surface, has a generally triangular shape.

16. The method as claimed in claim 1 wherein said housing is a casting.

17. The method as claimed in claim 16 wherein said housing includes inlet and outlet ports formed integrally with said housing.

18. The method as claimed in claim 16 wherein said housing includes at least one additional transverse opening for alignment purposes.

19. The method as claimed in claim 18 including the additional steps of providing a head retaining member, positioning a plurality of ink jet printing heads so formed on said retaining member, said member extending through said additional transverse opening of each of said housings.

20. The method of fabricating a housing and ink chamber for use in an ink jet printer head comprising the steps of forming a metal block having a circular transverse opening therein, said opening having an annular groove in the internal surface thereof, said internal surface being tapered to form a first conical surface, providing a mandrel formed of a first metal having an exterior conical surface complimentary with said first conical surface and capable of being dissolved by chemical reaction with a predetermined compound, plating said exterior surface of said mandrel with a second metal resistant to chemical reaction with said compound, plating each of said conical surfaces with a third metal capable of being cold welded, pressing said mandrel into said housing and forcing said conical surfaces into intimate contact thereby sealing said groove to form an annular ink chamber and welding said mandrel and said housing into an integral structure, and dissolving said mandrel with said compound thereby to cause said second metal to remain in engagement with said first conical surface and form a diaphragm seal.

21. The method as claimed in claim 20 wherein said first metal is aluminum.

22. The method as claimed in claim 21 wherein said second metal is nickel.

23. The method as claimed in claim 22 wherein said third metal is indium.

24. The method as claimed in claim 22 wherein said second metal is plated to a thickness of about 0.001 inches.

25. The method as claimed in claim 20 wherein said block is formed by die casting.

26. The method as claimed in claim 25 wherein said block is formed of an alloy of zinc.

27. The method as claimed in claim 20 wherein said mandrel has a circular groove in its outer surface positioned to interface with said groove in said block when said conical surfaces are in intimate contact.

* * * * *